(12) United States Patent
Meunier-Beillard et al.

(10) Patent No.: US 8,476,675 B2
(45) Date of Patent: *Jul. 2, 2013

(54) SEMICONDUCTOR DEVICE AND METHOD OF MANUFACTURE THEREOF

(75) Inventors: Philippe Meunier-Beillard, Kortenberg (BE); Johannes J. T. M. Donkers, Valkenswaard (NL); Erwin Hijzen, Haasrode (BE)

(73) Assignee: NXP B.V., Eindhoven (NL)

( * ) Notice: Subject to any disclaimer, the term of this patent is extended or adjusted under 35 U.S.C. 154(b) by 184 days.

This patent is subject to a terminal disclaimer.

(21) Appl. No.: 12/918,524

(22) PCT Filed: Feb. 26, 2009

(86) PCT No.: PCT/IB2009/050781
§ 371 (c)(1),
(2), (4) Date: Apr. 18, 2011

(87) PCT Pub. No.: WO2009/107086
PCT Pub. Date: Sep. 3, 2009

(65) Prior Publication Data
US 2011/0186841 A1 Aug. 4, 2011

(30) Foreign Application Priority Data

Feb. 28, 2008 (EP) .................................... 08102138
Feb. 28, 2008 (EP) .................................... 08102139

(51) Int. Cl.
*H01L 29/66* (2006.01)
(52) U.S. Cl.
USPC ........... 257/162; 257/254; 257/263; 257/265; 257/E21.311; 257/E21.379; 438/128; 438/189; 438/229
(58) Field of Classification Search
USPC .................. 257/162, 254, 263, 265, E21.311, 257/E21.379; 438/128, 189, 229
See application file for complete search history.

(56) References Cited

U.S. PATENT DOCUMENTS

| | | | |
|---|---|---|---|
| 5,445,976 | A | 8/1995 | Henderson et al. |
| 6,221,783 | B1 | 4/2001 | Park et al. |
| 7,008,851 | B2 | 3/2006 | Johansson et al. |
| 2002/0027232 | A1 | 3/2002 | Shigematsu et al. |
| 2005/0116254 | A1 | 6/2005 | Verma et al. |
| 2005/0212087 | A1 | 9/2005 | Akatsu et al. |
| 2011/0215417 | A1* | 9/2011 | Meunier-Beillard et al. . 257/378 |

FOREIGN PATENT DOCUMENTS

| | | |
|---|---|---|
| EP | 0339960 A2 | 11/1989 |
| WO | 2006/114746 A2 | 11/2006 |
| WO | 2007/144828 A1 | 12/2007 |
| WO | 2008/012737 A2 | 1/2008 |

OTHER PUBLICATIONS

Choi, L. J., et al; "A Novel Isolation Scheme Featuring Cavities in the Collector for a High Speed 0.13 UM SigE: C BiCMOS Technology"; IMEC.
Yamamoto, Y., et al; "Chemical Vapor Phase Etching of Polycrystalline Selective to Siptaxial Si and SiGe"; Thin Solid Films, vol. 508; p. 297-300; (2006).
Donkers, J.J.T.M., et al; "A Novel Fully Self-Aligned SiGe: C HBT Architecture Featuring a Single Step Epitaxial Collector-Base Process"; 3 Pages.
International Search Report and Written Opinion for Application PCT/IB2009/050781 (Feb. 26, 2009).

* cited by examiner

*Primary Examiner* — Telly Green

(57) ABSTRACT

A semiconductor device (10) comprising a bipolar transistor and a field 5 effect transistor within a semiconductor body (1) comprising a projecting mesa (5) within which are at least a portion of a collector region (22c and 22d) and a base region (33c) of the bipolar transistor. The bipolar transistor is provided with an insulating cavity (92b) provided in the collector region (22c and 22d). The insulating cavity (92b) may be provided by providing a layer (33a) in the collector region (22c), creating an access path, for example by selectively etching polysilicon towards monocrystalline, and removing a portion of the layer (33a) to provide the cavity using the access path. The layer (33a) provided in the collector region may be of SiGe:C. By blocking diffusion from the base region the insulating cavity (92b) provides a reduction in the base collector capacitance and can be described as defining the base contact.

14 Claims, 17 Drawing Sheets

SEMICONDUCTOR DEVICE AND METHOD OF MANUFACTURE THEREOF

Figure 1:
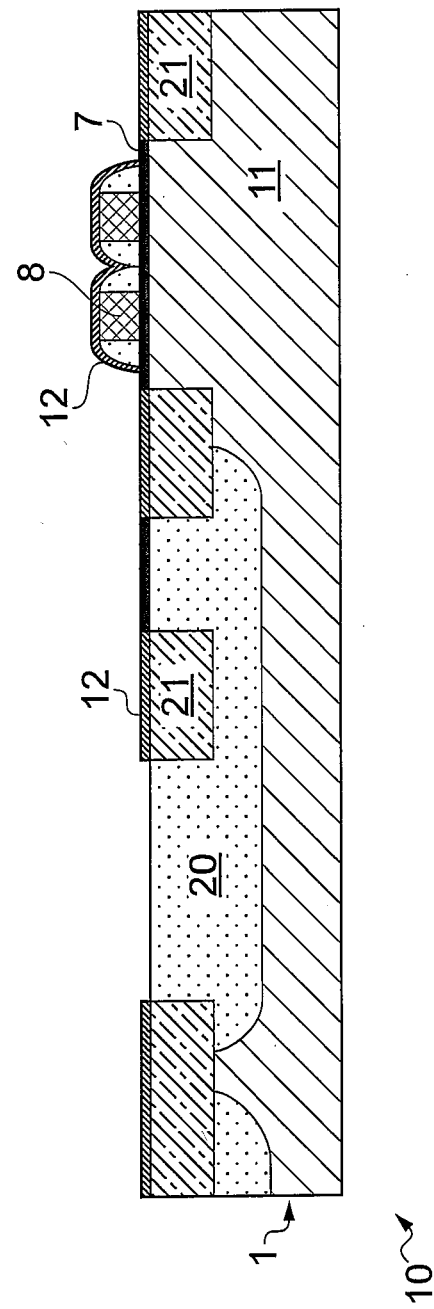

The present invention relates to a semiconductor device with a substrate and a semiconductor body comprising a bipolar transistor and a field effect transistor. The bipolar transistor comprises, in the following order, a collector region, a base region, and an emitter region, wherein the semiconductor body comprises a projecting mesa (which may also be termed pedestal) within which at least a portion of the collector region and a portion of the base region are present and which is surrounded by an isolation region. Such a device, in particular when constructed as a heterojunction bipolar transistor (HBT), is highly suitable for high-frequency amplifier applications. The invention also relates to a method of manufacturing such a device.

Such a device is known from the American patent document U.S. Pat. No. 7,008,851 published on Mar. 7, 2006. A bipolar transistor is described therein comprising a mesa within which a portion of the collector region and of the base region is located. A region forming a subcollector of the transistor is furthermore present in the substrate. The mesa comprises an n-type epitaxial silicon layer forming said portion of the collector region and a p-type epitaxial layer which contains germanium and within which the base region is formed. The mesa is surrounded by an isolating layer that was formed, in that the walls of a groove (a so-termed shallow trench) surrounding the mesa are coated with an isolating layer of silicon dioxide and this groove is subsequently filled up further with an oxide.

A disadvantage of the known device is that the high-frequency characteristics thereof are in need of improvement. In addition, the manufacture of the known device is comparatively complicated.

US 2005/0212087 A discloses a structure and method for forming a bipolar transistor. Cavities are formed below a Si:Ge intrinsic base of the transistor and around the collector.

International patent application PCT/IB2007/052220, incorporated herein by reference, describes a device of the kind mentioned in the opening paragraph in which the semiconductor device further comprises a field effect transistor with a source region, a drain region, an interposed channel region, and a superimposed gate dielectric and a gate region, which gate region forms a highest part of the field effect transistor, and the height of the mesa is greater than the height of the gate region. Parasitic components of the transistor are etched away using a dummy emitter thereby tending to provide a self-aligned collector extrinsic-base junction. However, this approach tends to make it difficult to control, for example, the base contact between the intrinsic base and boron-doped polysilicon used in the device.

The present inventors have realised it would be desirable to provide a semiconductor device comprising a bipolar transistor and a field effect transistor device, and manufacturing method therefor, in which self-aligned insulation-filled cavities are included and which tend to define the base contact and tend to allow reduction of the base-collector capacitance, and also tend to further reduce parasitic components.

In a first aspect, the present invention provides a semiconductor device with a substrate and a semiconductor body comprising a bipolar transistor with, in the following order, a collector region, a base region, and an emitter region, wherein the semiconductor body comprises a projecting mesa within which at least a portion of the collector region and the base region are present and which is surrounded by an isolation region, wherein the semiconductor device further comprises a field effect transistor; and the bipolar transistor is provided with an insulating cavity in the collector region.

The insulating cavity may be provided by providing a layer in the collector region, creating an access path to the layer, and removing a portion of the layer using the access path, so that a portion of the removed portion of the layer provides the location of the insulating cavity.

The access path may be created by selectively etching a polysilicon portion of the base towards a monocrystalline portion of the base.

A dummy emitter may be provided.

The access path may be created by defining a dummy emitter, and thereafter performing a dry etch.

The layer provided in the collector region may be of SiGe:C.

The insulating cavity may be filled with a gas.

The gas may be air.

The insulating cavity may be filled with silicon dioxide.

In a further aspect, the present invention provides a method of manufacturing a semiconductor device with a substrate and a semiconductor body comprising a bipolar transistor with, in the following order, a collector region, a base region, and an emitter region, wherein the semiconductor body comprises a projecting mesa within which at least a portion of the collector region and the base region are present and which is surrounded by an isolation region; the method further comprising providing the semiconductor device with a field effect transistor; and providing the bipolar transistor with an insulating cavity in the collector region.

The insulating cavity may be provided by providing a layer in the collector region, creating an access path to the layer, and removing a portion of the layer using the access path, so that a portion of the removed portion of the layer provides the location of the insulating cavity.

The access path may be created by selectively etching a polysilicon portion of the base towards a monocrystalline portion of the base.

A dummy emitter may be provided.

The access path may be created by defining a dummy emitter, and thereafter performing a dry etch.

The layer provided in the collector region may be of SiGe:C.

The insulating cavity may be filled with a gas.

The gas may be air.

The insulating cavity may be filled with silicon dioxide.

In further aspects, the present invention provides a semiconductor device comprising a bipolar transistor and a field effect transistor within a semiconductor body comprising a projecting mesa within which are at least a portion of a collector region and a base region of the bipolar transistor. The bipolar transistor is provided with an insulating cavity provided in the collector region. The insulating cavity may be provided by providing a layer in the collector region, creating an access path, for example by selectively etching polysilicon towards monocrystalline, and removing a portion of the layer to provide the cavity using the access path. The layer provided in the collector region may be of SiGe:C. The insulating cavity provides a reduction in the base collector capacitance and by blocking or reducing diffusion from the base region can be described as defining the base contact.

Thus a semiconductor device comprising a bipolar transistor and a field effect transistor device, and manufacturing method therefor, are provided in which an insulating cavity is provided and which defines the base contact and which provides a reduction in the base collector capacitance.

Embodiments of the present invention will now be described, by way of example, with reference to the accompanying drawings, in which:

FIGS. 1 to 17 diagrammatically and in a cross-section taken perpendicularly to the thickness direction show a first example of a device according to the invention in consecutive stages of its manufacture by a method according to the invention.

The Figures are not drawn true to scale, the dimensions in the thickness direction being particularly exaggerated for the sake of clarity, and moreover the relative thicknesses of the different layers are not drawn to scale.

FIGS. 1 to 17 diagrammatically and in a cross-section taken perpendicularly to the thickness direction show a first example of a device according to the invention in consecutive stages of its manufacture by a method according to the invention.

The starting point is a p-type Si substrate 11 (see FIG. 1). An epitaxial silicon layer may possibly be deposited on the substrate 11, if so desired. Then a mask (not shown), for example of photoresist, is provided, through which a recessed n-type semiconductor region 20 can be formed by means of an n-type ion implantation, such as arsenic ions. After removal of the mask, isolating regions 21 in the form of STI (Shallow Trench Isolation) are formed in a similar manner. A silicon oxide layer is subsequently provided on the—cleaned—surface of the semiconductor body 1 by means of thermal oxidation, for example at 1000° C., which layer is patterned so as to form a gate dielectric region 7. A conductive polycrystalline silicon layer is now deposited with which a gate region 8 is formed. The regions mentioned above form part of a field effect transistor that in its turn is part of the device 10. In this example the field effect transistor is completed for the major part, two such transistors, NMOS in this case, being diagrammatically depicted in the right-hand part of FIG. 1. The source region and the drain region of the left-hand and the right-hand transistor, respectively, and a common source/drain region have not been shown in the drawing. The gate regions 8 are provided with spacers on either side. A covering layer 12 is provided in a pattern over the entire structure. This layer comprises a stack of silicon oxide and silicon nitride layers here which serves not only as a nucleating layer for a subsequent epitaxial step but also as a protective layer for the previously formed MOS transistors. Ideally (as shown) the covering layer 12 extends over the whole of the isolating regions 21, although in practice this is not essential because both the isolating region 21 and the covering layer 12 result in polycrystalline growth when n-type silicon is deposited thereon in a later epitaxial deposition step (see below).

Subsequently (see FIG. 2) a semiconductor layer structure is provided in a single epitaxial process, comprising in the following order: a first n-type silicon layer 22a; a first silicon-germanium-carbon (SiGe:C) layer 33a (in which the carbon is only present at approximately 0.2% hence the layer may alternatively be considered as or referred to as silicon-germanium); a second n-type silicon layer 22b; and a p-type silicon-germanium-carbon (SiGe:C) composite layer 33b (in which the carbon is only present at approximately 0.2% hence the layer may alternatively be considered as or referred to as silicon-germanium). In this embodiment, the (SiGe:C) composite layer 33b comprises, in the following order, an undoped Si—Ge:C layer 331, a boron doped Si—Ge:C layer 332, an undoped Si—Ge:C layer 333, and a silicon layer 334.

In the above described layers, the conductivity types and compositions are adapted in a simple manner through a change in the composition of the gas conducted through the epitaxy reactor.

Figure 2:
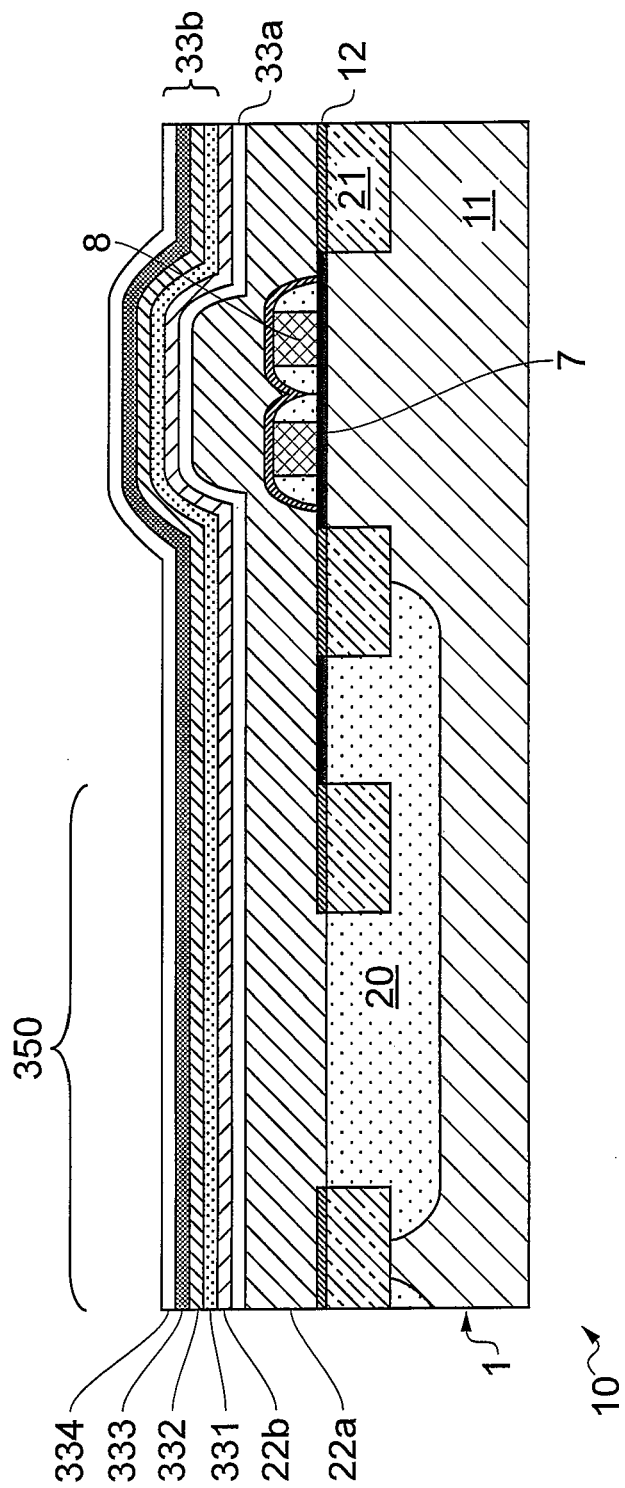
Figure 3:
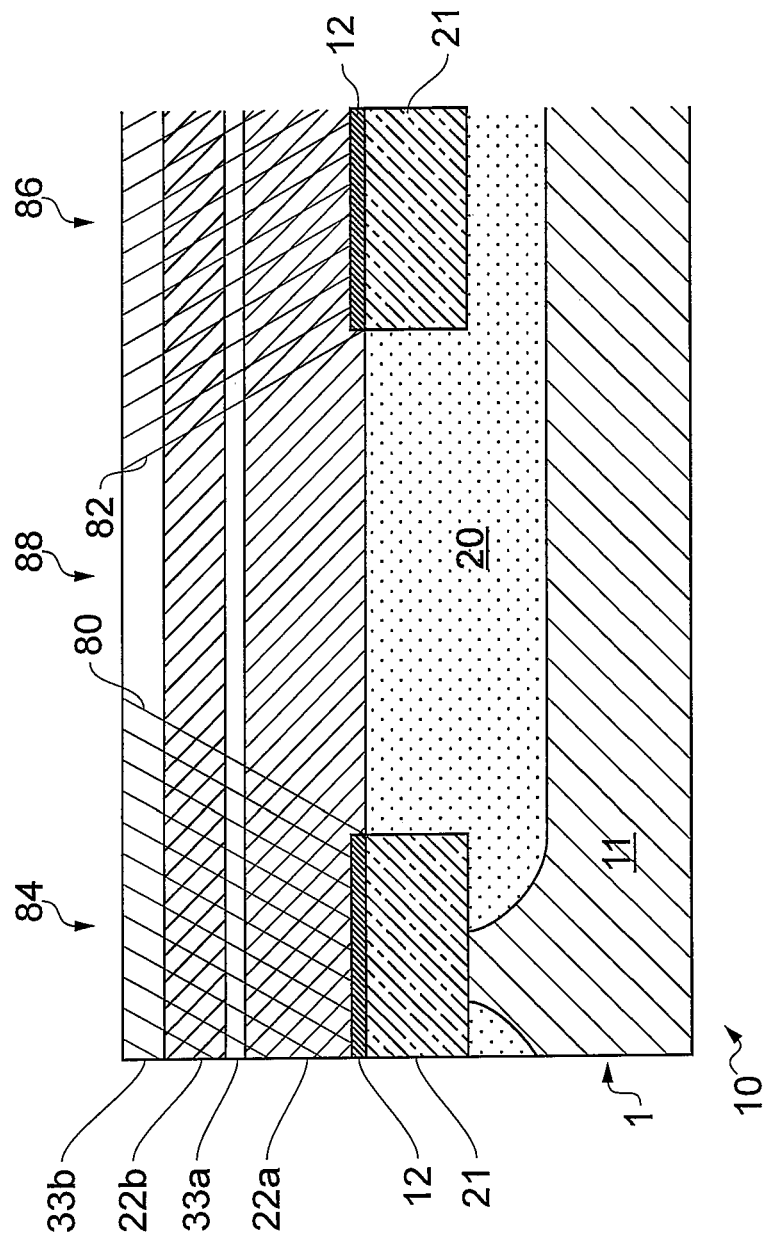
Figure 4:
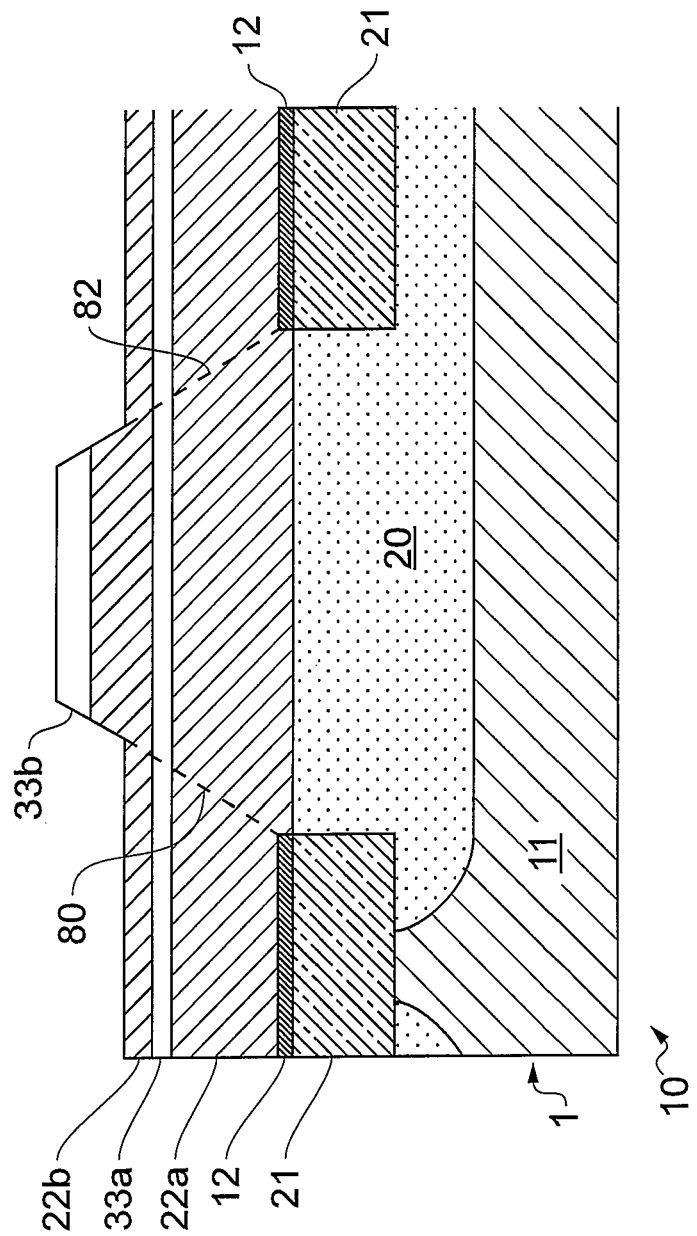
Figure 5:
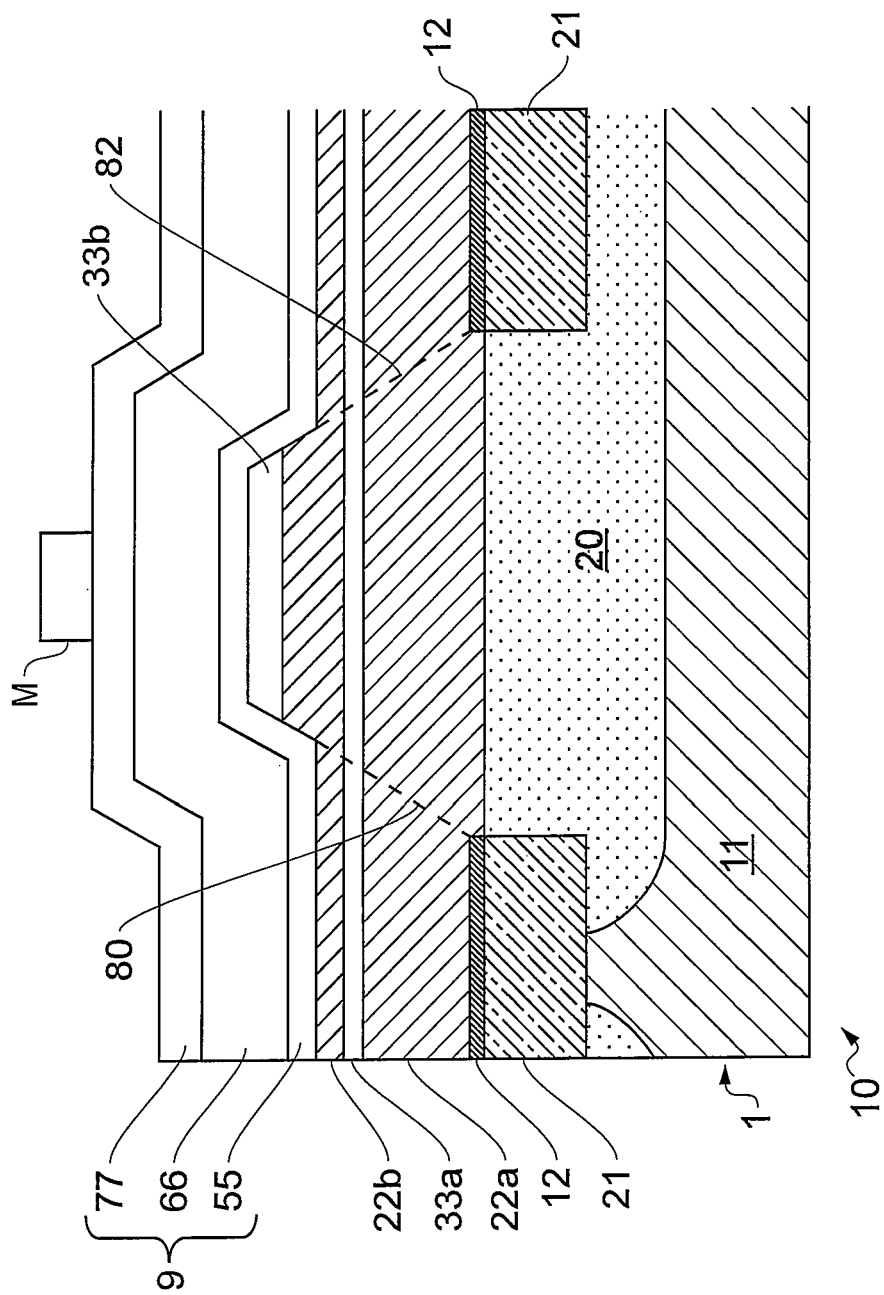

Further details of the n-type silicon layers 22a and 22b, and the SiGe:C layers 33a and 33b will now be described with reference to FIG. 3, which shows just portion 350 (see FIG. 2) of the structure shown in FIG. 2. For simplicity, in FIG. 3 composite layer 33b is shown as a single layer. It will be appreciated that processes and materials applied in the remainder of the manufacturing process as described below with reference to FIGS. 3-17 are applied to the whole extent of the structure shown in FIG. 2, i.e. to the extent lying outside of portion 350 as well as inside portion 350, in a manner readily understood by the skilled person.

During the above described epitaxial process, the parts of the layers that derive from the interface with the covering layer 12 grow as polycrystalline layers, whereas the parts of the layers that derive from the interface with the uncovered n-type semiconductor region 20 of the silicon substrate grow as monocrystalline layers. The polycrystalline layers will tends to extend in increasing degree into the monocrystalline layers. The resulting structure is shown in FIG. 3. In particular, a first dividing line 80 and a second dividing line 82 are shown for representing dividing lines between a first polycrystalline region 84 and a second polycrystalline region 86, each polycrystalline region indicated by additional shading lines drawn parallel to their respective dividing line 80, 82. A monocrystalline region 88, in the shape of a trapezium as viewed in FIG. 3, is therefore provided and can be seen as that region without the additional shading lines. It will be appreciated that each of the first polycrystalline region 84, the second polycrystalline region 86 and the monocrystalline region 88 extends throughout each of the four layers grown during the epitaxial process, i.e. each of the first n-type silicon layers 22a, the SiGe:C layer 33a, the second n-type silicon layer 22b, and the composite SiGe:C layer 33b. This division between polycrystalline and monocrystalline regions will be exploited in subsequent process steps as will be described in detail below. It is noted that when the covering layer 12 does not extend over the whole of the isolating region 21, the division between polycrystalline and monocrystalline regions is not substantially changed because growth on the isolating region 21 is also polycrystalline.

Subsequently (see FIG. 4) a polycrystalline Si/SiGe selective etch towards monocrystalline silicon is performed (i.e. an etch that selectively removes the polycrystalline regions 84, 86 of silicon and SiGe:C but not the monocrystalline region 88). The etch is stopped in the second n-type silicon layer 22b. In the resulting structure the composite SiGe:C layer 33b and an upper portion of the second n-type silicon layer 22b have a profile following along the dividing lines 80, 82 which are shown as dotted lines in FIG. 4. In other embodiments, the process window of this step can be enlarged by choosing the growth condition of the silicon layer such that the polycrystalline region of the second n-type silicon layer 22b is grown thicker than the monocrystalline region of the second n-type silicon layer 22b, for example twice as thick.

Subsequently (see FIG. 5) a sacrificial layer structure is provided on the semiconductor layer structure by means of CVD. The sacrificial layer structure comprises, in the following order, a silicon dioxide layer 55, a silicon nitride layer 66, and a silicon dioxide layer 77. Then a mask M, of photoresist in this case, is provided in a pattern on top of the sacrificial layer structure aligned over an approximately central part of the remaining area of the composite SiGe:C layer 33b.

Figure 6:
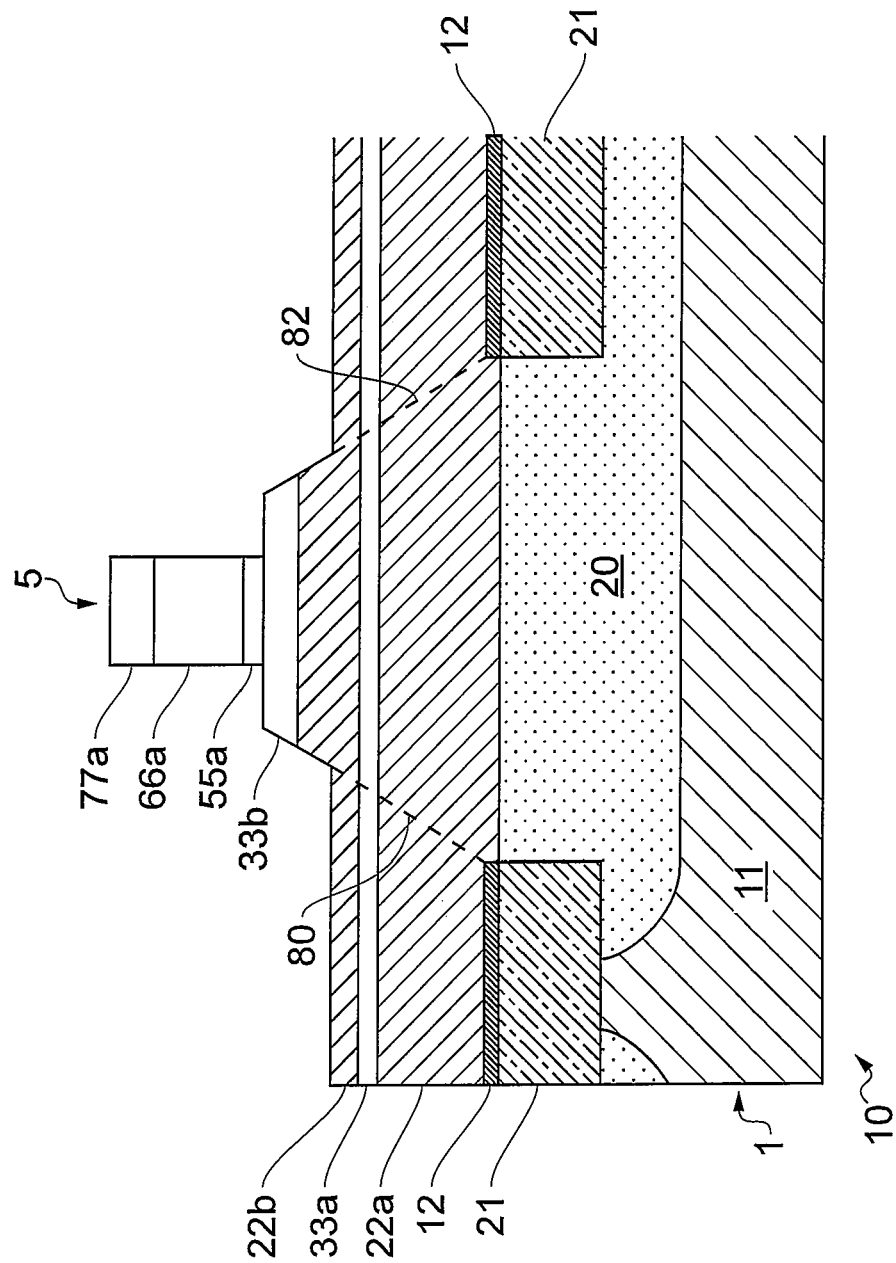
Figure 7:
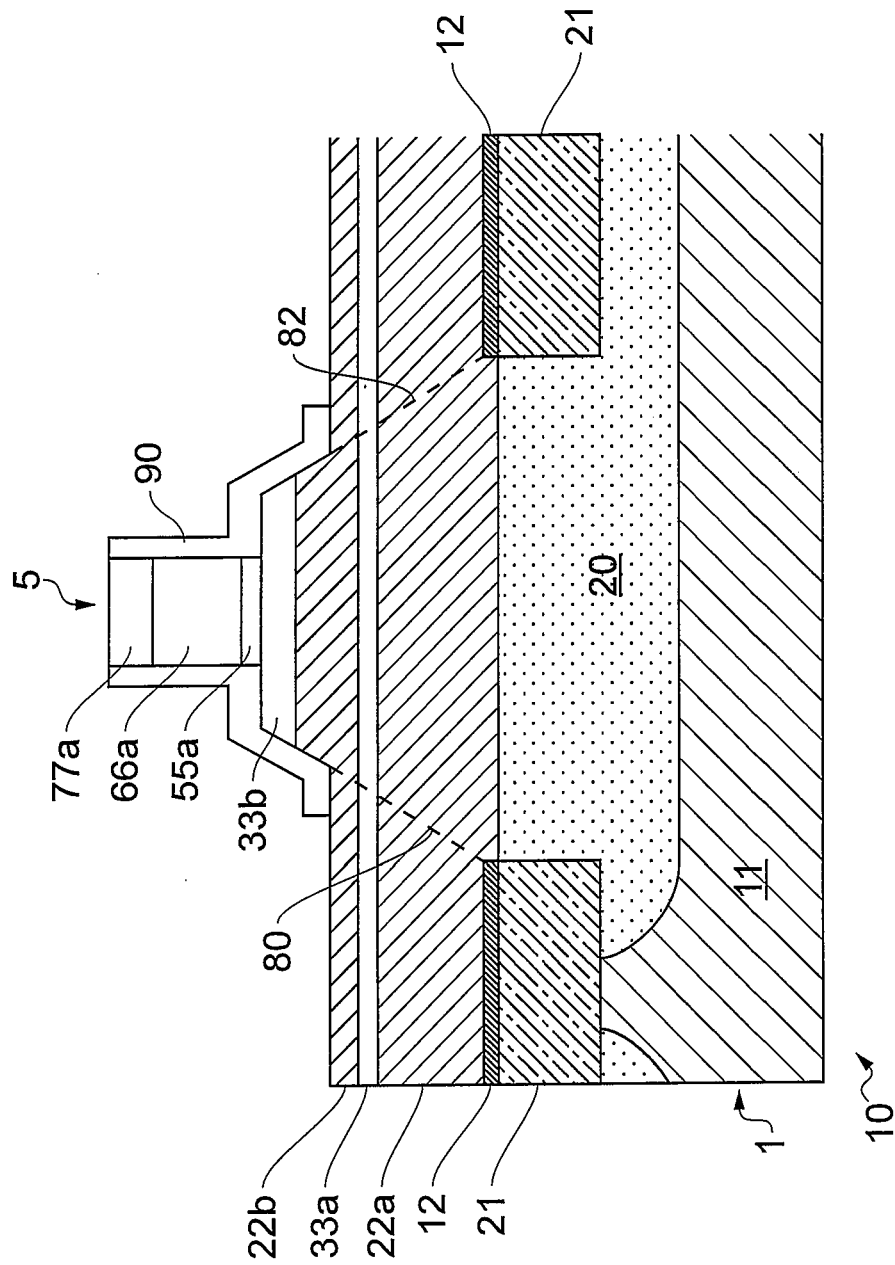
Figure 8:
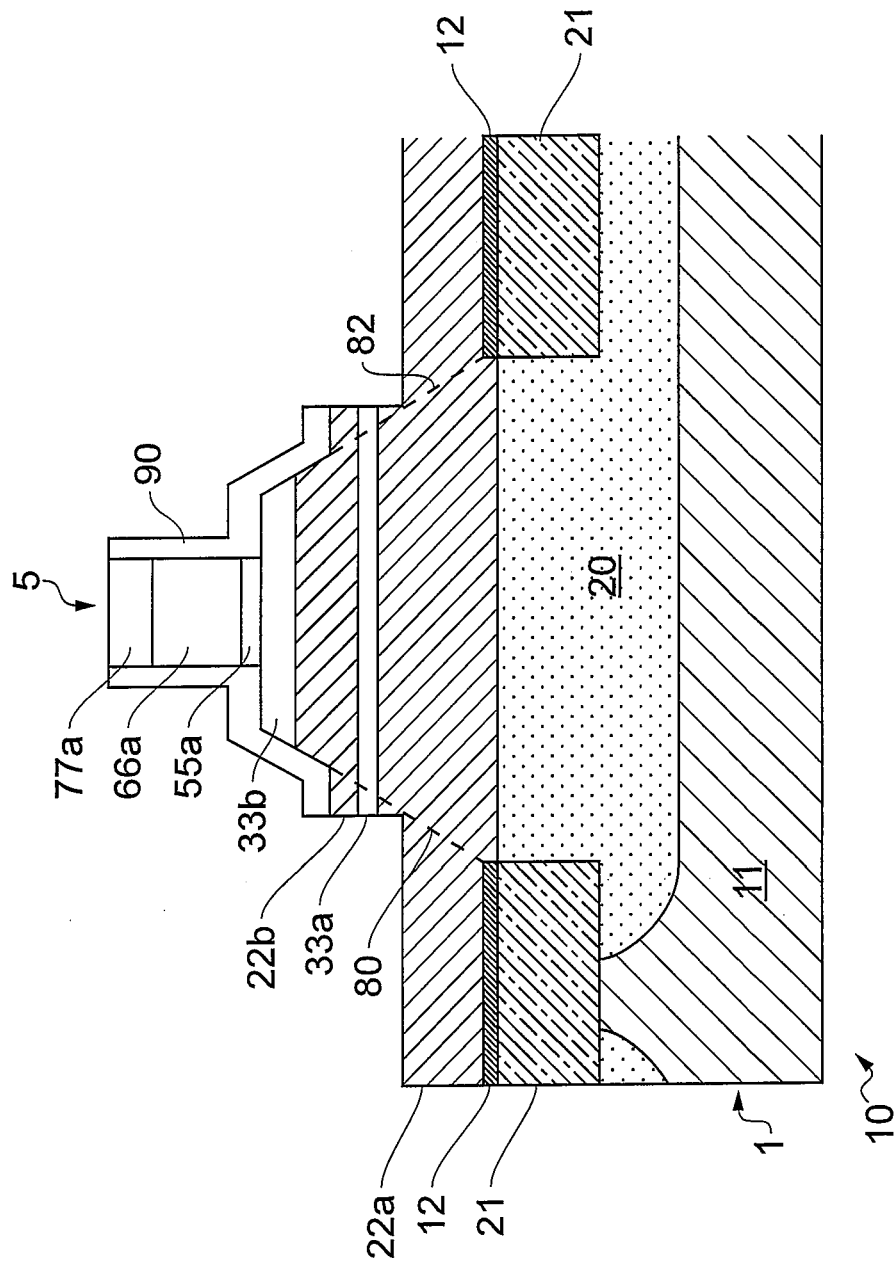
Figure 9:
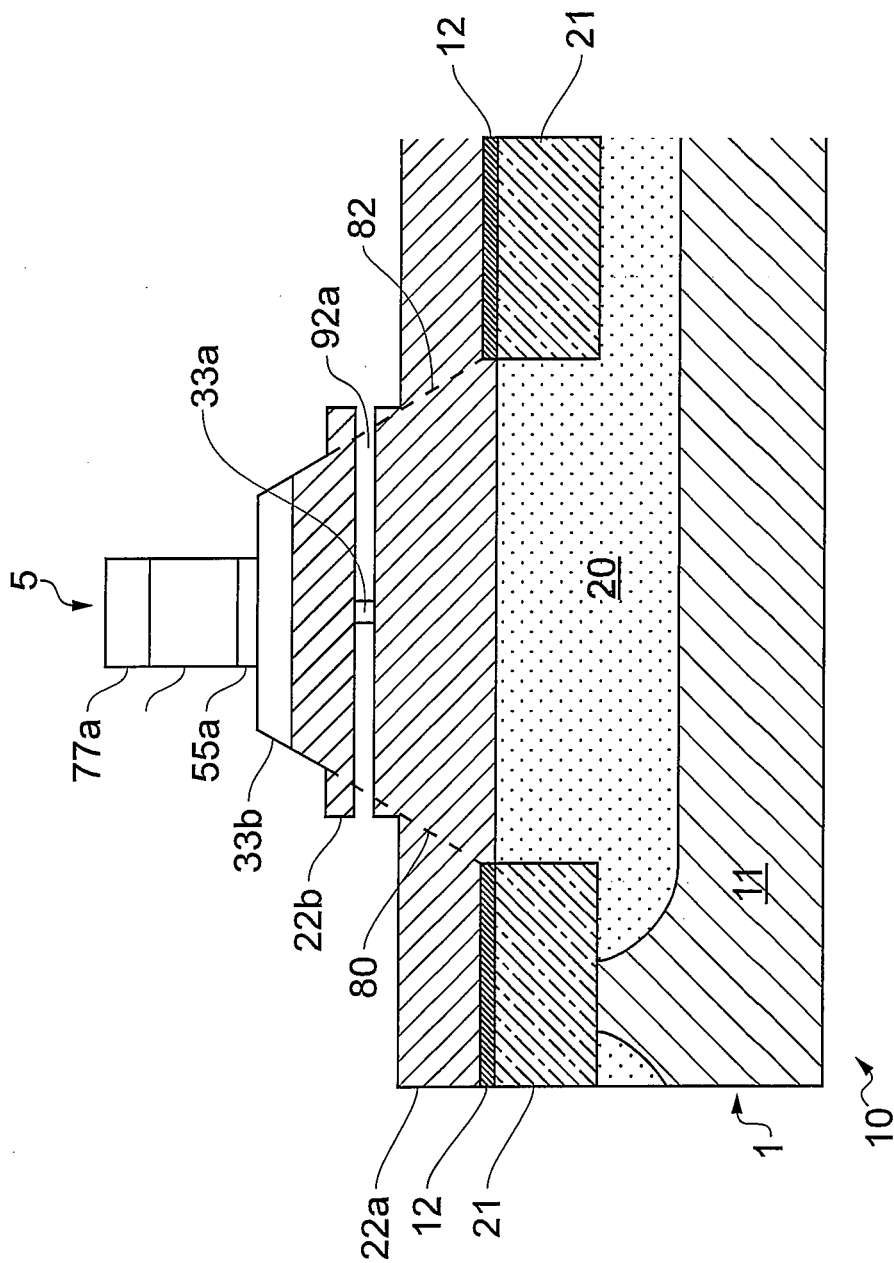
Figure 10:
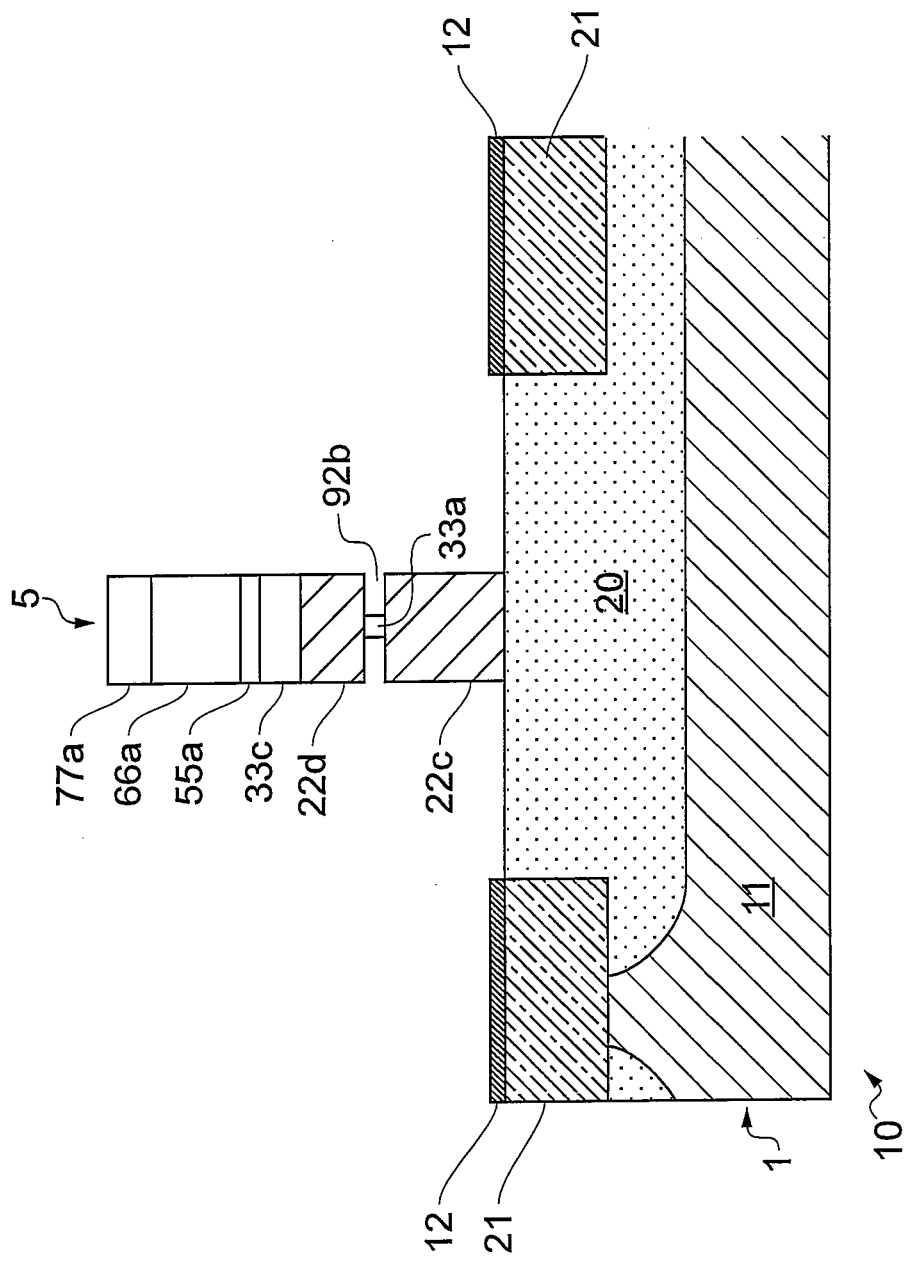

Subsequently (see FIG. 6) a mesa (which may also be referred to as a pedestal) 5 is formed in the (semiconductor) layer structure by means of etching, for example RIE (Reactive Ion Etching) or some other dry etching process, and including respective portions (defined by the mask M) 55a, 66a, 77a of the layers 55, 66, 77. Then the mask M is removed, leaving the structure as shown in FIG. 6.

Subsequently a nitride layer and then a thick oxide sacrificial layer are deposited on the semiconductor layer structure. Then, in conventional fashion, the thick oxide sacrificial layer and some of the nitride layer is etched away to leave (see FIG. 7) a nitride "L-shaped" spacer 90 provided around the edges of each of the silicon dioxide portion 55a, the silicon nitride portion 66a, and the silicon dioxide portion 77a, on the exposed top surface and around the edges of the composite SiGe:C layer 33b, around that edge of the second n-type silicon layer 22b that adjoins the edge of the composite SiGe:C layer 33b and on a portion of the adjoining top surface of the second n-type silicon layer 22b. The latter portion does not extend as far as the start of the respective insulating region.

Subsequently (see FIG. 8) an etch step is performed in which the nitride L-shaped spacer 90 is used in effect as the etching mask. The etch removes material (other than the silicon dioxide portion 77a) that is not under the L-shaped spacer. The etch is performed such as to remove (in the relevant area): the whole depth of second n-type silicon layer 22b, the whole depth of the SiGe:C layer 33a, and some of the depth of the first n-type silicon layer 22a. This etch is performed to expose the edge of the SiGe:C layer 33a, so that a cavity can later be provided by side etching the SiGe:C layer 33a, as will be described in more detail below.

Subsequently (see FIG. 9) a selective SiGe etch towards silicon is performed (i.e. an etch that selectively removes SiGe:C from the edge-exposed SiGe:C layer 33a but not from exposed silicon regions). The etch is time-controlled so that it stops before etching away all the material of the SiGe:C layer 33a, but such that the edges of the SiGe:C layer 33a lie within the projection of the edges of the silicon dioxide portion 55a, the silicon nitride portion 66a, and the silicon dioxide portion 77a. This leaves (see FIG. 9) the narrower remaining portion of SiGe:C layer 33a surrounded by a cavity 92a, the cavity 92a corresponding to the position of the material of SiGe:C layer 33a removed in this selective SiGe etch towards silicon i.e. positioned around the narrower remaining portion of SiGe:C layer 33a and between the first n-type silicon layer 22a and the remaining portion of the second n-type silicon layer 22b (the extent of the remaining portion of the second n-type silicon layer 22b having been defined by the nitride L-shaped spacer 90). The cavity 92a is immediately under the second n-type silicon layer 22b.

Subsequently (see again FIG. 9) a nitride etch is performed to remove the nitride L-shaped spacer 92a which has now performed its masking role.

Subsequently (see FIG. 10) a dry etch is performed, for example by reactive ion etching. The effective mask for the etching is the silicon dioxide portion 77a at the top of the mesa 5. Etching is continued down to the silicon surface of the recessed n-type semiconductor region 20 and down to the covering layer 12. Due to this etching step, the composite SiGe:C layer 33b, the second n-type silicon layer 22b and the first n-type silicon layer 22a are reduced in width to a width defined by/corresponding to the width of the silicon dioxide portion 77a at the top of the mesa 5. The remaining portion of the first n-type silicon layer 22a with width defined as above provides a first part of the collector region of the bipolar transistor and is indicated by reference numeral 22c. The remaining portion of the second n-type silicon layer 22b with width defined as above provides a second part of the collector region of the bipolar transistor and is indicated by reference numeral 22d. The first part 22c of the collector region of the bipolar transistor and the second part 22d of the collector region of the bipolar transistor together provide the overall collector region of the bipolar transistor. The remaining portion of the composite SiGe:C layer 33b with width defined as above provides the base region (indicated by reference numeral 33c) of the bipolar transistor. Another outcome of this etching step is that the above described cavity 92a is reduced in width to a cavity indicated by reference numeral 92b in FIG. 10, with its outer extent defined by/corresponding to the width of the silicon dioxide portion 77a at the top of the mesa 5 and its inner extent still defined by the above described narrower remaining portion of SiGe:C layer 33a. The cavity 92b is thus in the collector region 22c, 22d, i.e. between the first part 22c of the collector region and the second part 22d of the collector region of the bipolar transistor.

Subsequently (see FIG. 11) an electrically insulating layer 16, of high density plasma (HDP) silicon dioxide in this case, is deposited over the structure. By virtue of this step the cavity 92b is filled with insulating silicon dioxide. In other embodiments, the deposition process at this step may be determined, adjusted or controlled to provide trapped air (or other gas as required) in the cavity surrounded by silicon dioxide, the trapped air (or other gas) serving as an insulator for the cavity 92b. (As an aside, it is also noted that by virtue of this silicon dioxide deposition step, the silicon dioxide portion 77a at the top of the mesa 5 is effectively incorporated, at least in a functional sense, into the newly deposited silicon dioxide insulating layer 16.)

Subsequently (see FIG. 12) the resulting structure is planarized by chemical mechanical planarization (CMP).

Subsequently the insulating layer 16 is etched back on either side of the mesa 5 and stopped in the second part 22d of the collector region, i.e. at a position approximately level with the top of the second part 22d of the collector region i.e. at a position approximately level with the bottom of the base region 33c.

Subsequently a conductive polycrystalline silicon layer 13, in this case boron-doped (i.e. p-doped), is deposited.

During the thermal anneal process that is used to activate the dopants in both the bipolar and the MOS transistors, the second part of the collector region 22d will be p-type doped from the conductive polycrystalline silicon layer 13. The diffusion of this p-type dopant is effectively blocked at the cavity 92b, thus preventing it from further moving into the first part of the collector region 22c which is n-type doped. This effectively limits the area over which the p-type base dopant and the n-type collector dopant meet. This strongly decreases the parasitic base-collector capacitance.

Figure 13:
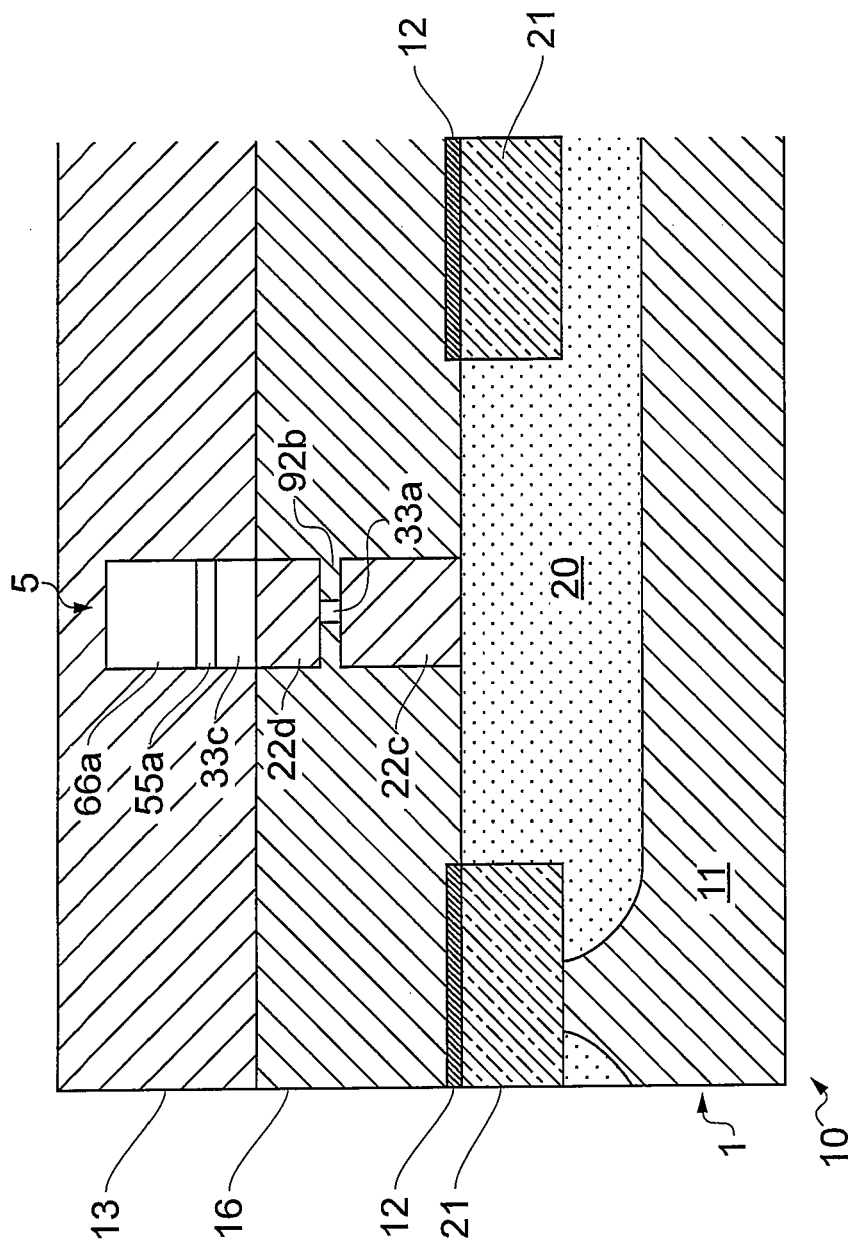
Figure 14:
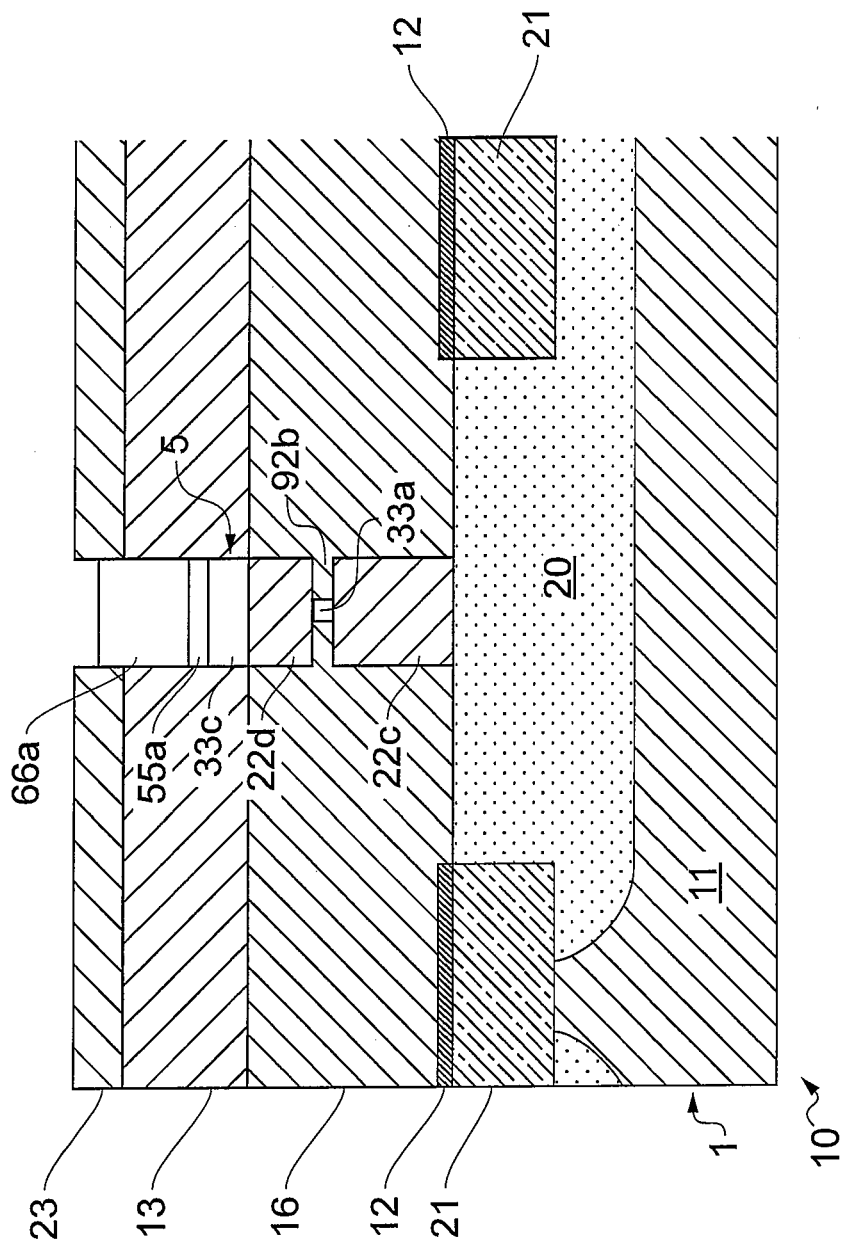
Figure 15:
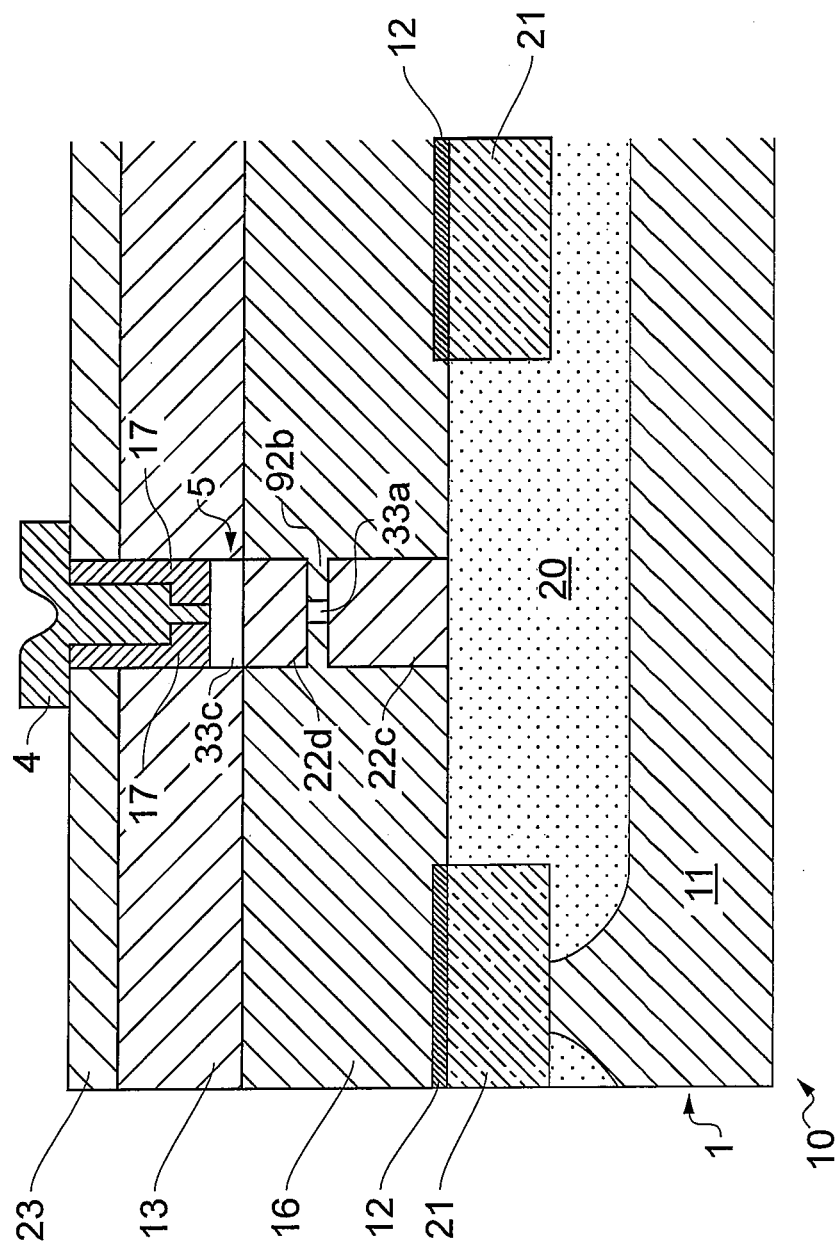
Figure 16:
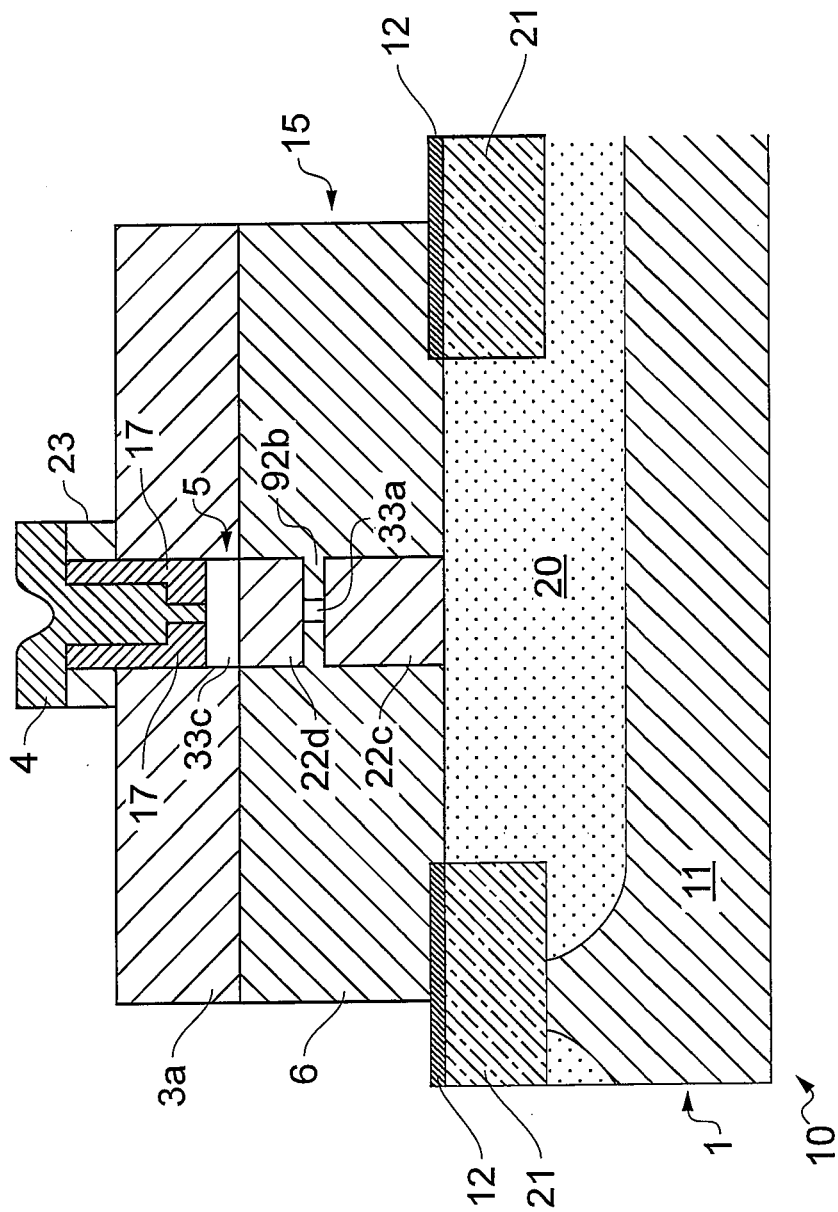
Figure 17:
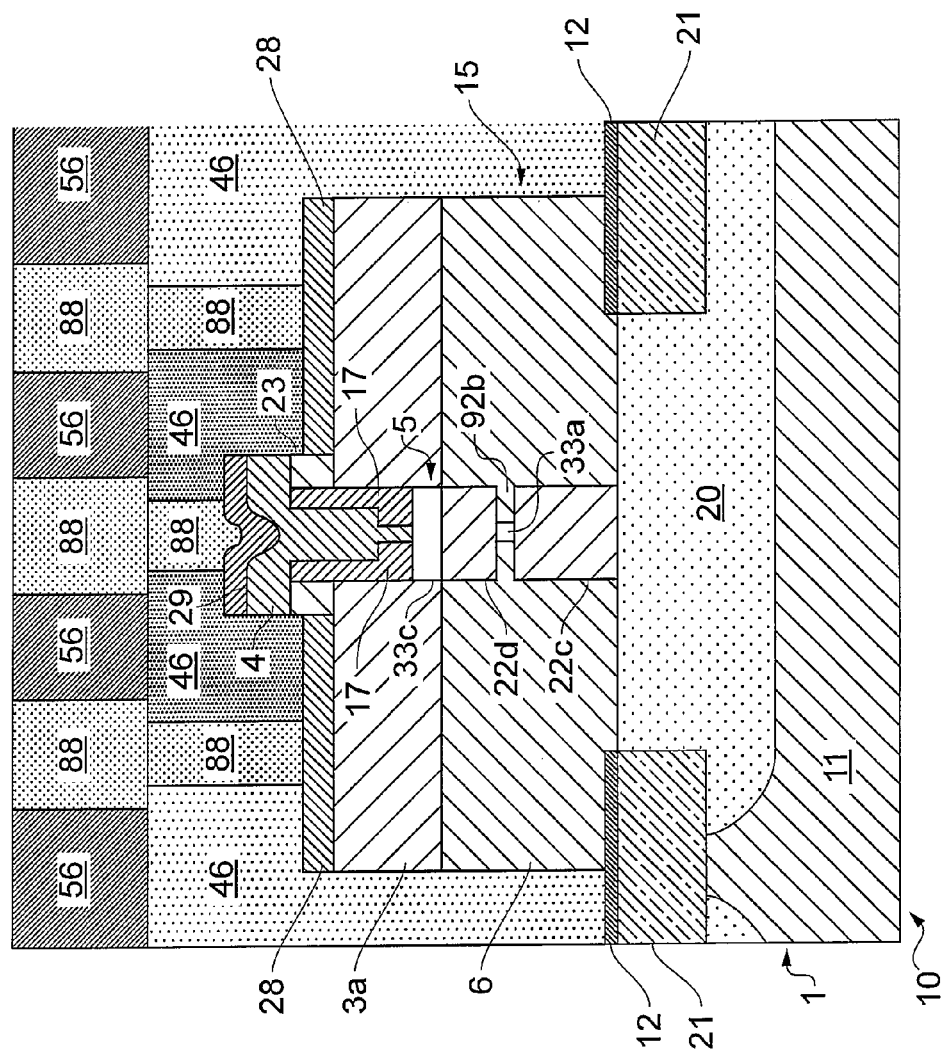

The resulting structure is then planarized leaving the conductive polycrystalline silicon layer 13 planarized above the silicon nitride portion 66a as shown in FIG. 13.

Subsequently (see FIG. 14) the upper side of the conductive polycrystalline silicon layer 13 is then converted into an isolating region 23 of silicon dioxide by means of wet thermal oxidation.

Subsequently (see FIG. 15) the silicon nitride portion 66a and the silicon dioxide portion 55a are removed in a few (selective) etching steps. This provides the structure with a cavity, in which spacers 17 are formed, of silicon nitride in this case, through deposition of a uniform layer followed by the removal of the horizontal portions thereof through anisotropic etching. A polycrystalline silicon layer 4 is then deposited and patterned, said layer forming an epitaxial/monocrystalline emitter region 4 of the bipolar transistor in the cavity between the spacers 17.

Subsequently (see FIG. 16), with the emitter region 4 serving as a mask, the isolating region 23 is removed outside the emitter region 4 by means of etching, whereby a base connection region 3a is exposed i.e. formed from the conductive polycrystalline silicon layer 13. A further mesa 15 is then formed around the mesa 5 by means of etching with a mask (not shown), for example made of photoresist, thus forming from the isolating layer 16 an isolation region 6 which surrounds the bipolar transistor.

Subsequently (see FIG. 17) the portions of the covering layer 12 exposed during the formation of the further mesa 15 is removed by etching, whereupon both the emitter region 4 and the base connection region 3a are provided with respective silicide regions 28, 29, such as of nickel or cobalt silicide. The source and drain regions and the gate region of the field effect transistor(s) may be provided with metal silicide regions at the same time. After further isolating layers 46, 56 have been provided and have been given suitable openings by means of photolithography, electrical connections 88 are provided therein with which both the bipolar transistor and the field effect transistor can be electrically connected.

Figure 11:
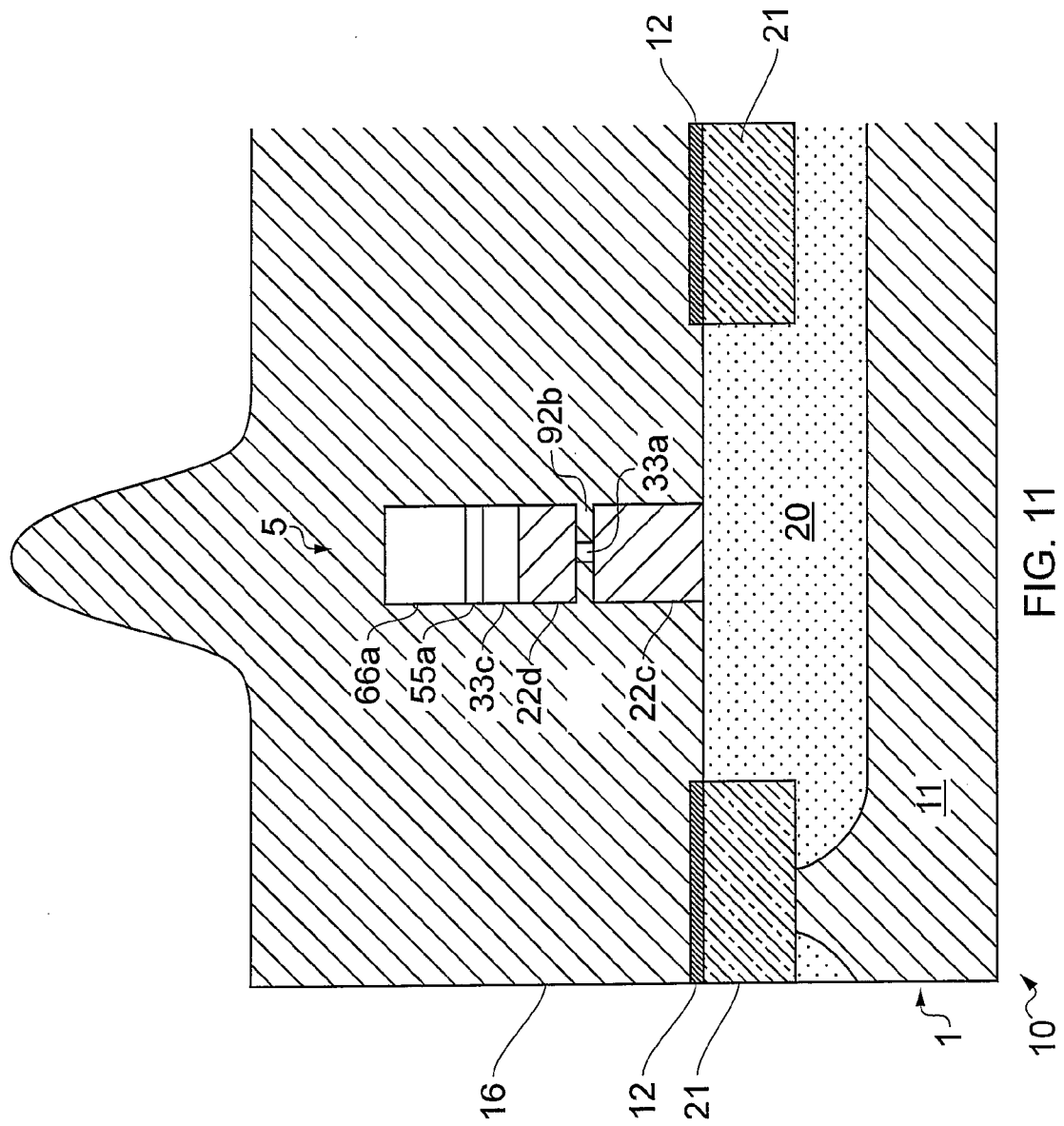
Figure 12:
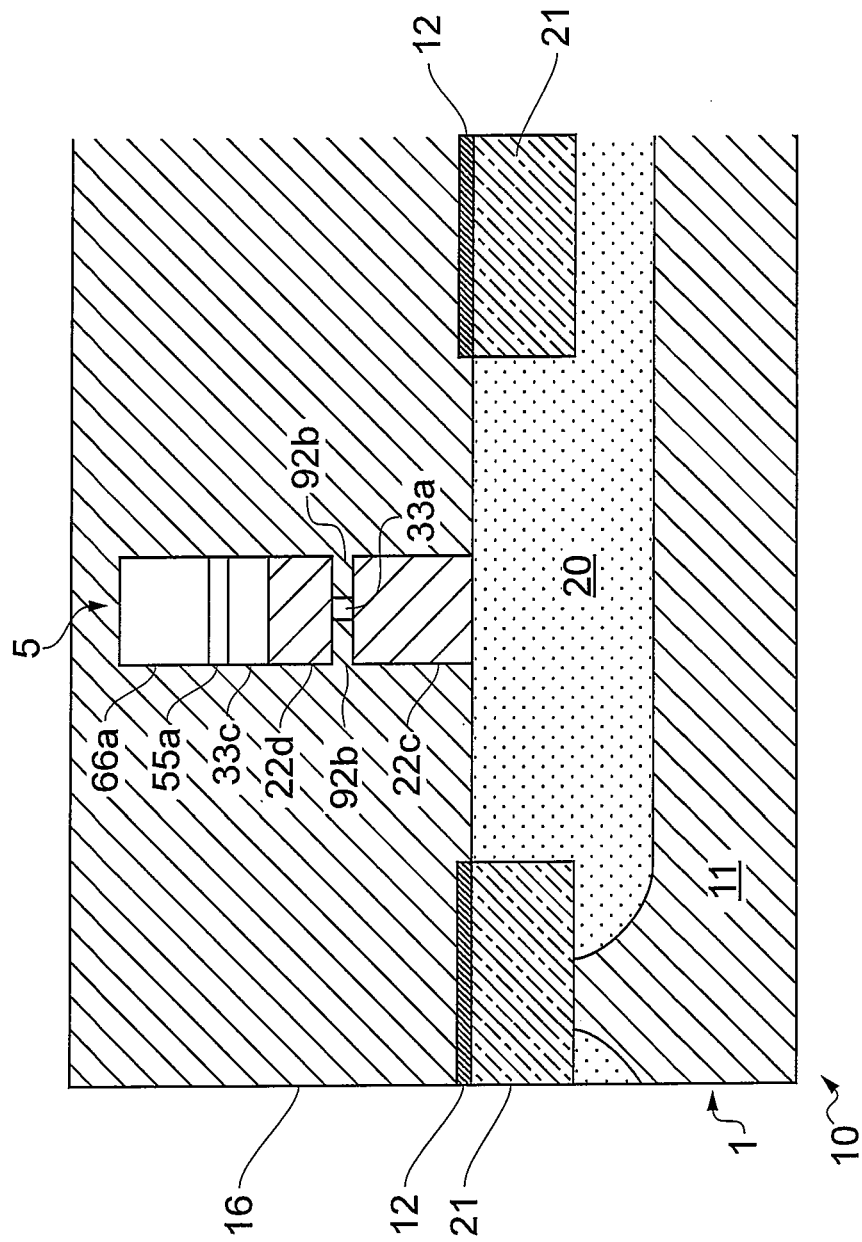

In the above described embodiment, the insulating cavity 92b is formed by the end of the processes described with reference to FIG. 11. Thereafter, a process of manufacturing one example of a possible overall structure has been described with reference to FIGS. 12-17. It will however be appreciated that any suitable overall structure may be provided to the embodiment of the invention represented by the structure shown in FIG. 11. For example, other field effect transistors may be provided instead of the one described above.

It will furthermore be appreciated that in other embodiments, other materials or layer configurations other than those described above may be employed. For example, one or more of the SiGe:C layers 33a and 33b may be replaced by other material. Also for example, alternative materials and/or processes may be used for the dummy emitter and the spacers. Also for example, instead of using the in-situ selective etch as described above with reference to FIG. 4, the base may be etched away after the emitter definition during the process described with reference to FIG. 6.

Thus a semiconductor device comprising a bipolar transistor and a field effect transistor device, and manufacturing method therefor, are provided in which a self-aligned insulating cavity, for example an oxide cavity or gas (e.g. air) cavity, is provided for blocking diffusion from the base region of the bipolar transistor. As such, the insulating cavity can be described as defining the base contact. The insulating cavity provides a reduction in the base collector capacitance. For example, a layer, for example SiGe:C is introduced in the collector of the bipolar transistor (the collector being underneath the base), and an access path to this layer is created. This may be done (as described above) by etching before dummy emitter definition and by removing selectively a polysilicon portion of the base layer towards a monocrystalline portion of the base layer. In other embodiments, this may be done using dry etching after the emitter definition. Spacers are defined on the dummy emitter so that the spacers overlap the region where the base is not present. The polysilicon is etched deep enough so that the SiGe:C layer (or other material) is etched laterally underneath the collector (and base). The spacers are removed and the remainder of the device is processed accordingly.

The invention claimed is:

1. A semiconductor device with a substrate and a semiconductor body comprising a bipolar transistor with, in the following order, a collector region having a first part and a second part, a base region, and an emitter region, wherein the semiconductor body comprises a projecting mesa within which at least a portion of the collector region and the base region are present and which is surrounded by an isolation region; wherein that the semiconductor device further comprises a field effect transistor; and the bipolar transistor further comprises a layer and an insulating cavity between the first part and the second part of the collector region.

2. A semiconductor device according to claim 1, wherein the layer provided in the collector region is of SiGe:C.

3. A semiconductor device according to claim 1, wherein the insulating cavity is filled with a gas.

4. A semiconductor device according to claim 3 wherein the gas is air.

5. A semiconductor device according to claim 1, wherein the insulating cavity is filled with silicon dioxide.

6. A method of manufacturing a semiconductor device, the method comprising:
   providing a substrate;
   forming a field effect transistor of the semiconductor device on the substrate;
   forming a semiconductor body on the substrate, a semiconductor body comprising a bipolar transistor with, in the following order;
   a first part of a collector region of the bipolar transistor;
   a layer;
   a second part of the collector region;
   a base region, and
   an emitter region,
   wherein the semiconductor body comprises a projecting mesa within which at least a portion of the collector region and the base region are present;
   forming an insulating cavity in the layer between the first part and the second part of the collector region; and
   surrounding the mesa with an isolation region.

7. A method according to claim 6, wherein the insulating cavity is provided by providing a layer in the collector region, creating an access path to the layer, and removing a portion of the layer using the access path, so that a portion of the removed portion of the layer provides the location of the insulating cavity.

8. A method according to claim 7, wherein the access path is created by selectively etching a polysilicon portion of the base towards a monocrystalline portion of the base.

9. A method according to claim 8, wherein a dummy emitter is provided.

10. A method according to claim 7, wherein the access path is created by defining a dummy emitter, and thereafter performing a dry etch.

11. A method according to claim 7, wherein the layer provided in the collector region is of SiGe:C.

12. A method according to claim 6, wherein the insulating cavity is filled with a gas.

13. A method according to claim 12 wherein the gas is air.

14. A method according to claim 12, wherein the insulating cavity is filled with silicon dioxide.

* * * * *